(12) United States Patent
Aal et al.

(10) Patent No.: US 12,032,016 B2
(45) Date of Patent: Jul. 9, 2024

(54) ELECTRONIC COMPONENT AND SYSTEM WITH INTEGRATED SELF-TEST FUNCTIONALITY

(71) Applicants: Volkswagen Aktiengesellschaft, Wolfsburg (DE); GOEPEL ELECTRONIC GMBH, Jena (DE)

(72) Inventors: Andreas Aal, Braunschweig (DE); Hosea Busse, Jena (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 368 days.

(21) Appl. No.: 17/603,874

(22) PCT Filed: Apr. 9, 2020

(86) PCT No.: PCT/EP2020/060180
§ 371 (c)(1),
(2) Date: Oct. 14, 2021

(87) PCT Pub. No.: WO2020/212249
PCT Pub. Date: Oct. 22, 2020

(65) Prior Publication Data
US 2022/0196725 A1 Jun. 23, 2022

(30) Foreign Application Priority Data
Apr. 17, 2019 (EP) ..................................... 19169951

(51) Int. Cl.
*G01R 31/28* (2006.01)
*H01L 25/065* (2023.01)
*H01L 25/10* (2006.01)

(52) U.S. Cl.
CPC ...... *G01R 31/2856* (2013.01); *H01L 25/0657* (2013.01); *H01L 25/105* (2013.01); *H01L 2225/06596* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS 8,799,730 B2  8/2014 Oh et al. ....................... 714/727
9,524,884 B2  12/2016 Han
(Continued)

FOREIGN PATENT DOCUMENTS

EP       1182548 A2    2/2002  ............... G06F 1/20
KR  1020120119960 A  11/2012  ............. H01L 21/60
(Continued)

OTHER PUBLICATIONS

Korean Office Action, Application No. 1020217037334, 22 pages.
(Continued)

*Primary Examiner* — Tung X Nguyen
(74) *Attorney, Agent, or Firm* — Slayden Grubert Beard PLLC

(57) ABSTRACT

The invention relates to an electronic component comprising a first integrated sub-circuit having a defined interface and a defined fixed-hardware functionality, a second, reconfigurable integrated sub-circuit being signal-connected via the interface to the first sub-circuit to exchange signals therewith, and optionally supply energy thereto, and one or more terminals for electrically connecting the electronic component to its periphery. The second sub-circuit is configured as an interface circuit between the one or more terminals and the first sub-circuit. The second sub-circuit is further configured as a reconfigurable integrated testing unit to test said (Continued)

hardware functionality of the first sub-circuit by applying one or more input signals to the first circuit and evaluating one or more output signals received via the interface from the first sub-circuit in response to the one or more input signals for conformance with one or more predetermined test criteria.

19 Claims, 6 Drawing Sheets

(56) References Cited

U.S. PATENT DOCUMENTS

| | | | |
|---|---|---|---|
| 9,570,147 B2 | 2/2017 | Kim | |
| 9,582,012 B2 | 2/2017 | Park et al. | |
| 10,200,196 B1 | 2/2019 | Rodriguez De et al. | |
| 2002/0104051 A1* | 8/2002 | Gupta | G01R 31/318519 714/733 |
| 2015/0295307 A1 | 10/2015 | Cook et al. | 343/812 |
| 2018/0231587 A1* | 8/2018 | Ye | H01J 37/32174 |

FOREIGN PATENT DOCUMENTS

| | | | |
|---|---|---|---|
| KR | 1020150003035 A | 1/2015 | H04L 12/10 |
| KR | 1020150120794 A | 10/2015 | H01L 21/56 |
| KR | 1020160086507 A | 7/2016 | G11C 11/406 |
| KR | 1020160142834 A | 12/2016 | G05B 15/02 |
| WO | 2004/102623 A2 | 11/2004 | G06F 17/50 |
| WO | 2020/212249 A1 | 10/2020 | G01R 31/28 |

OTHER PUBLICATIONS

Saia, R.J. et al., "3-D Stacking Using the GE High Density Multichip Module Technology," International Conference and Exhibition on Multichip Modules, pp. 285-292.

Abramaovici, Miron et al., "BIST-Based Test and Diagnosis of FPGA Logic Blocks," IEEE Transactions on Very Large Scale Integration (VLSI) Systems, vol. 9, No. 1, pp. 159-172.

Minz, Jacob et al., "Thermal and Cross-Talk Aware Physical Design for 3D System-on-Package," 55$^{th}$ IEEE Proceedings of the Electronic Components and Technology Conference, vol. 2, No. 1, pp. 824-831.

Extended European Search Report, Application No. 19169951.1, 26 pages.

Partial International Search Report and Invitation to Pay Additional Fees, Application No. PCT/EP2020/060180, 13 pages.

International Search Report and Written Opinion, Application No. PCT/EP2020/060180, 19 pages.

* cited by examiner

ELECTRONIC COMPONENT AND SYSTEM WITH INTEGRATED SELF-TEST FUNCTIONALITY

CROSS-REFERENCE TO RELATED APPLICATIONS

This application claims priority to European Patent Application No. EP 19 169 951.1, filed on Apr. 17, 2019 with the European Patent Office. The contents of the aforesaid Patent Application are incorporated herein for all purposes.

TECHNICAL FIELD

The present invention relates to the field of self-testing of electronic components, such as integrated circuits, e.g., systems-on-chip (SOC), systems-in-package (SIP) and multi-chip modules (MCM) comprising two or more separate integrated circuits. Particularly, without limitation, the invention is applicable for use in the field of automotive applications.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

In many modern applications, including in particular in automotive applications, electronic components play a pivotal role in enabling such applications. For example, modern vehicle engines, e.g., car engines, air conditions, safety systems, braking systems and many other vehicle subsystems rely on and are controlled by control units incorporating one or more electronic components, such as for example microcontroller integrated circuits (ICs).

Typically, at the end of the production process of electronic components, e.g., ICs, the produced component is thoroughly tested to verify that the component conforms to its specification. Such tests typically comprise verifying the correct electrical performance of the component and also its environmental and mechanical performances. In some fields of application, including in the field of automotive applications, however, such components need to withstand varying and sometimes harsh environmental conditions, which could have an impact on the reliability of such components.

Currently available test and qualification procedures, including in particular the above-mentioned tests at the end of a typical production process, usually cannot adapt fast enough to the ever-changing application-specific requirements of such demanding applications, including in particular those of automotive environments. Although some currently available on-chip test solutions provide a variety of different test functionalities, these can neither be extended nor modified, esp. corrected, once the manufacturing process for such chips is completed. In particular, such known solutions do not provide the possibility to adapt or modify test functionalities in view of the occurrence of operational or environmental events while the component is in use and is subject to changing environmental conditions and related operational loads and challenges.

As a consequence, a manufacturer of a system comprising one or more of such components is confronted with a scenario, where either the risks resulting from remaining test and qualification gaps need to be accepted or mitigated by additional measurements, like addition of (further) redundancy (which may cause over-engineering), or where the use of such components is not feasible, e.g., in the case of safety-relevant applications. The latter case is often applicable for automotive applications, which can have a negative impact on the availability or performance of features to be introduced into a vehicle that are based on the use of such components.

SUMMARY

A need exists to further improve the testability of such electronic components and systems-in-package comprising such components throughout their lifetime.

The need is addressed by the subject matter of the independent claims. Embodiments of the invention are described in the dependent claims, the following description, and the drawings.

DESCRIPTION

Figure 1:
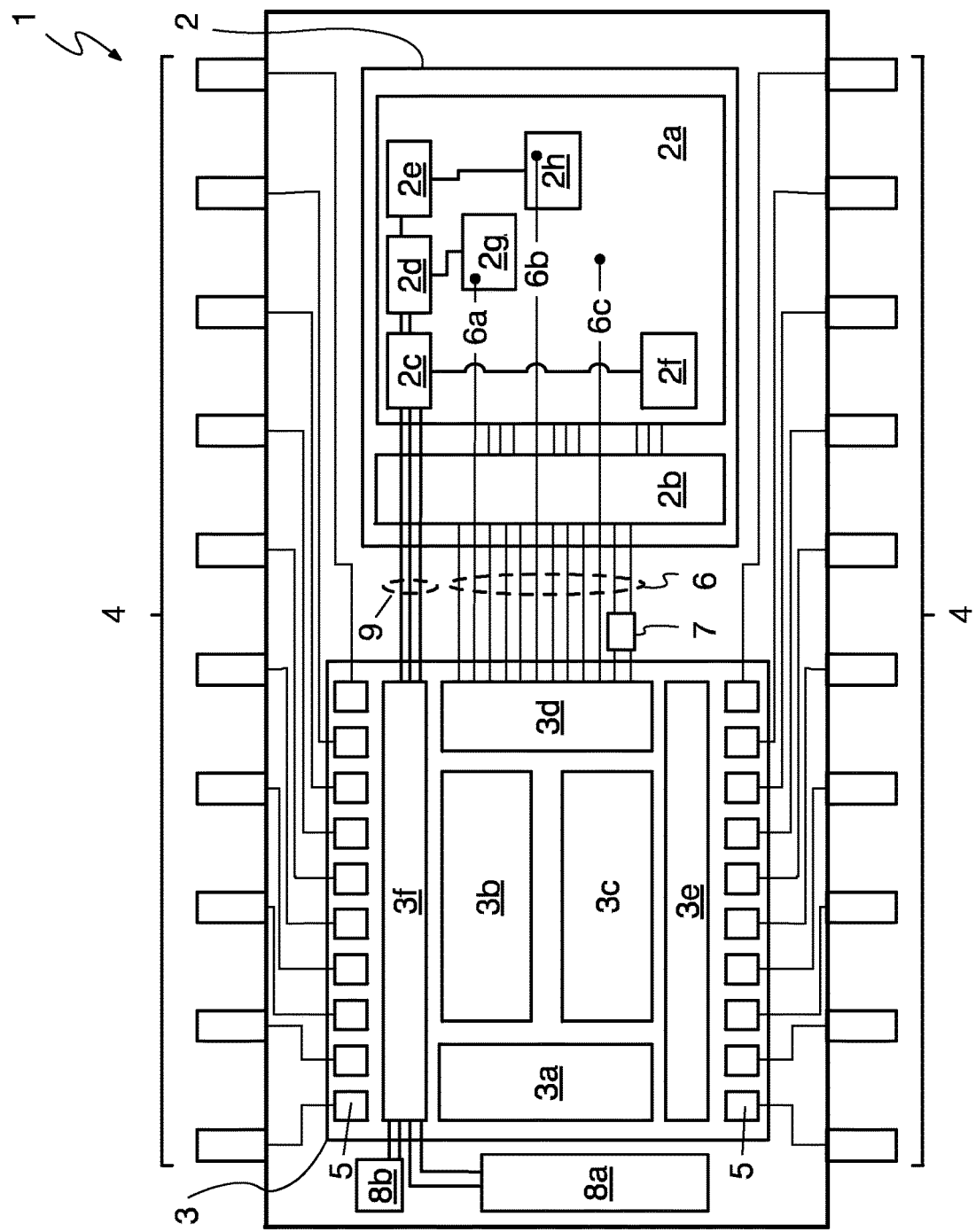
FIG. 1 schematically illustrates a block diagram of an exemplary embodiment of an electronic component with a first and a second sub-circuit.

The details of one or more embodiments are set forth in the accompanying drawings and the description below. Other features will be apparent from the description, drawings, and from the claims.

In the following description of embodiments of the invention, specific details are described in order to provide a thorough understanding of the invention. However, it will be apparent to one of ordinary skill in the art that the invention may be practiced without these specific details. In other instances, well-known features have not been described in detail to avoid unnecessarily complicating the instant description.

A first exemplary aspect is directed to an electronic component comprising (i) a first integrated sub-circuit having a defined interface and a defined fixed-hardware functionality, (ii) a second, reconfigurable integrated sub-circuit being signal-connected via the interface to the first sub-circuit to exchange signals therewith, and optionally supply energy thereto; and (iii) one or more terminals for electrically connecting the electronic component to its periphery. The second sub-circuit is configured as an interface circuit between the one or more terminals and the first sub-circuit. The second sub-circuit is further configured as a reconfigurable integrated testing unit to test said hardware functionality of the first sub-circuit by applying one or more input signals to the first circuit and evaluating one or more output signals received via the interface from the first sub-circuit in response to the one or more input signals for conformance with one or more predetermined test criteria.

The term "electronic component", as used herein, refers to a discrete device or physical entity for use in an electronic system used to affect electrons or their associated fields and currents. Specifically, an integrated semiconductor circuit (IC) or a component comprising multiple interconnected ICs is each deemed an electronic component. For example and without limitation, (i) a system-on-chip (SOC), (ii) a system-in-package (SIP), (iii) a package-on-package (PoP) configuration comprising multiple individually packaged ICs, (iv) a multi-chip-module (MCM), and (v) a circuit board, e.g. PCB, comprising one or more ICs being embedded therein, are each covered by the term "electronic component", as used herein.

The term "integrated sub-circuit", as used herein, refers to a multi-element (e.g., multiple interconnected transistors or other electronic elements) circuit portion of the electronic component, which circuit portion is present in integrated form, i.e., integrated in an IC that forms a part of or is identical to the component.

Accordingly, the term "integrated testing unit", as used herein, refers to a multi-element circuit portion of the electronic component, which circuit portion is present in integrated form and has a testing functionality for testing the first sub-circuit or at least one or more parts thereof. Specifically and without limitation, an integrated sub-circuit may consist of or comprise one or more semiconductor IP cores, i.e., one or more reusable units of logic or functionality or one or more cells or one or more layout designs, each being designed as a building block to be integrated in a variety of different integrated circuits. For example, such a semiconductor IP core may be an implementation of a microprocessor or a whole microcontroller system, peripheral controller or other communication-related functionality or an interface, an encoder and/or decoder, a memory unit, or mixed-signal block such as A/D-converter or D/A-converter. The IP cores may even be from different vendors and may particularly be sold or otherwise distributed as soft cores or as hard cores.

The term, "fixed-hardware functionality", as used herein refers to a hardware functionality of an integrated circuit or sub-circuit thereof, which is implemented in hardware in such a way that it cannot be modified, i.e., "re-wired", through normal operation of the IC. For example and without limitation, the circuitry, i.e. hardware, of a microprocessor or microcontroller device usually has a fixed-hardware functionality (i.e. the CPU, registers, cache etc.), although, of course, the overall functionality of the microprocessor or microcontroller device, which also comprises functionality implemented in firmware of software, may be altered by replacing or modifying the firmware or software that is executed on it. To the contrary, a hardware functionality of a hardware that may be operationally restructured, e.g., "rewired", such as to change its functionality, e.g., a hardware functionality of a Field Programmable Gate Array (FPGA) or of other hardware-reconfigurable logic blocks, is not considered a "fixed hardware functionality".

Accordingly, the electronic component according to the first exemplary aspect already comprises itself a testing functionality for testing the first sub-circuit, which testing may be performed during operation of the component during its whole lifetime. Accordingly, the first sub-circuit may be referred to as a "device under test" (DUT), i.e., depending on its implementation, e.g., a separate integrated device (IC) or a sub-circuit of an integrated device having further sub-circuits, which DUT is interconnected with the second sub-circuit that in turn has a testing functionality to test the DUT via its interface. In fact, this testing functionality may even be dynamically altered during the lifetime of the electronic component based on its reconfigurability. As will be described in detail below, the functionality of the second sub-circuit in relation to the first sub-circuit may even comprise a variety of further aspects. In particular, the functionality of the second sub-circuit may vary over the lifetime of the component such as to adapt to specific developments during that lifetime and to ensure that the first sub-circuit's lifetime-determining conformance to its specification can in many cases be prolonged.

While it is a further benefit that both sub-circuits are combined in the same electronic component, which thus can be handled, distributed and operated as a single device, the second sub-circuit may nevertheless be designed as a reconfigurable device or circuit block that can be reused in connection with and for testing a variety of different DUTs. The present solution also allows for using the benefits of both predetermined fixed-hardware circuitry and flexible, i.e., reprogrammable circuitry. While the fixed-hardware-circuitry may typically be implemented at a very high level of integration and thus high performance and space efficiency (small form factor and low cost), the flexibility that may be provided specifically in the second sub-circuit forms the basis of a lot of different advanced functionalities of the overall component, as will be described in detail below in relation to various embodiments.

A further benefit of the solution is that the configuration of the terminals of the component, i.e., its pinout, may remain constant over multiple versions or even generations of the component although these different versions or generations contain different versions of at least the first sub-circuit, the interface of which may even change from version or generation to version or generation, respectively.

In the following embodiments of the electronic component are described, which can be arbitrarily combined with each other or with other aspects of the teachings herein, unless such combination is explicitly excluded, e.g., when certain embodiments are only described as alternatives to each other, or technically impossible.

According to some embodiments, the fixed-hardware functionality of the first sub-circuit is an automotive specific functionality. For example and without limitation, such functionality may relate to engine control, braking control, controlling one or more safety systems or features, air conditioning, an infotainment system, a lighting system, a head unit, communication system, body-control systems, security features (e.g. in the context of long-term upgradeability of selected systems) or a man-machine-interface of a vehicle.

According to some embodiments, the component is configured such that any signal between the one or more terminals and the first sub-circuit of the component (i.e., in forward or reverse direction or both) passes through the second sub-circuit, which thus forms a sole interface circuit between the one or more terminals and the first sub-circuit. In this way, the testing to be performed by the second sub-circuit is not affected by any (wire-based) interaction of the first sub-circuit with another entity unknown to the second sub-circuit and therefore the second sub-circuit can take the role of gatekeeper for any signal connection between the first sub-circuit and the component's periphery. As will be described in more detail below, this may be particularly beneficial in view of ensuring the integrity and security of the operation of the first sub-circuit.

According to some embodiments, the second sub-circuit is further configured to perform one or more of the following functions in relation to the first sub-circuit: (i) measure or monitor one or more signals or electrical properties of the first sub-circuit; (ii) control or feed-back control the first sub-circuit. Such measuring and monitoring may not only be used for determining a current state or operation of the first sub-circuit, but also to measure and monitor the first sub-circuit's interaction with the second sub-circuit itself or the component's periphery. Controlling or feedback-controlling the first sub-circuit may particularly serve the purpose of having the second sub-circuit act as a master of the first sub-circuit acting as a corresponding slave, or of an interface circuit that transforms inputs received via the terminals from the component's periphery to corresponding control signals conforming to the first sub-circuits interface and capabilities to thus control the first sub-circuit accordingly based on these inputs.

According to some embodiments, the second sub-circuit is further configured—according to the following variants (i) through (iii)—to: (i) substitute one or more functionalities of the first sub-circuit by performing them in the second sub-circuit instead of the first sub-circuit; (ii) substitute one or more functionalities of a reprogrammable portion of the first sub-circuit by reprogramming that portion with program data being present in the second sub-circuit; or (iii) extend one or more functionalities of the first sub-circuit by performing one or more extensions of functionalities of the first sub-circuit.

Variant (i) may particularly be applied for replacing a no longer needed functionality of the first sub-circuit by another functionality being available in the second sub-circuit, or for defining a workaround solution in case the to be substitute functionality of the first sub-circuit has been found to be defect or otherwise malfunctioning. In the latter case, although the defect or malfunctioning portion itself is not corrected, a workaround is established that can take over the function of the defect/malfunctioning portion and thus ensure that the component as a whole continues to operate properly (i.e., conforms to specification) and that this function remains available.

On the other hand, if the first sub-circuit comprises in addition to its fixed-hardware functionality one or more reprogrammable portions and the defect/malfunctioning has its cause in one or more of these reprogrammable portions, based on variant (ii) an actual bug fix, i.e. a correction of the defect/malfunctioning portion may be achieved by reprogramming these one or more reprogrammable portions with program data being present in the second sub-circuit, e.g. as a backup solution or as part of the regular functionality of the second sub-circuit itself.

Thus, according to some embodiments related particularly to variants (i) and (ii), the functionality of the first sub-circuit to be substituted is a functionality that was detected by an error detection functionality of the electronic component as being defect. Thus, the component as a whole has a self-correcting capability. This is particularly useful when the component is used in harsh environmental or load conditions or in applications that require a superior level of reliability, e.g., safety or security-related applications. Specifically, many automotive applications provide such tough conditions and/or have at the same time such high reliability requirements.

According to variant (iii) one or more functionalities that are implemented in the first sub-circuit may be extended by using additional resources being present in the second sub-circuit. For example, the second sub-circuit might provide additional memory capacity or processing capacity or sub-functions, such that a performance or capability of a base functionality being implemented in the first sub-circuit may be turned into an enhanced functionality based on the contribution of the second sub-circuit.

According to some embodiments related particularly to variants (i) and (ii), the second sub-circuit is further configured to substitute or extend a test functionality being implemented in the first sub-circuit itself, at least in parts. For example, if the first sub-circuit comprises test cells, such as for a boundary scan, and one or more of these test cells are detected as being defect, according to these embodiments these defect test cells may be replaced by good test cells being implemented in the second sub-circuit (cf. variant (i)). To the extent that the defect test cells are implemented in a reprogrammable portion of the first sub-circuit, also variant (ii) may be used to correct the defect.

According to some embodiments, the second sub-circuit further comprises a programmable circuit structure. The programmable circuit structure may particularly comprise one or more of: (i) a field-programmable gate array, FPGA, and (ii) a programmable processor platform that is configured to emulate the functionality of the second sub-circuit, at least in parts and, particularly, with respect to said testing of at least one of said fixed-hardware functions of the first sub-circuit, based on a real-time operating system running on the processor platform. These embodiments may particularly be used to implement reconfigurable or replaceable test instruments for testing the first sub-circuit or parts thereof. Specifically, the second sub-circuit may comprise a memory containing code for implementing different test instruments and depending on a current test case, and applicable code is loaded into the programmable circuit structure to be executed there for the purpose of implementing the related test instrument. In this way, a library of different test instruments may be maintained in the second sub-circuit or a separate memory circuit of the component or even in the first sub-circuit itself, in a very compact way, because same programmable circuit structure can be used to dynamically implement different test instruments at different times, while the necessary code can be stored in a very space-efficient manner in a storage, e.g. non-volatile memory (e.g. embedded flash memory) or even in a, typically highly space-efficient, read only memory (ROM).

According to some embodiments, the signal connection between the first and the second integrated sub-circuits is an electrical connection that comprises one or more impedance matching devices being configured to optimize a proper transmission of RF-signals over the electrical connection. One benefit of combining both the first and second sub-circuits in a single component is particularly relevant in the case that high-frequency signals, e.g. radiofrequency (RF) signals, need to be exchanged between the two sub-circuits. Since such signals are very sensitive to all kinds of parasitic impedances and capacities and so forth, transmission of such signals over longer distances is typically challenging and requires countermeasures to maintain a sufficient signal quality. If the first and second sub-circuits are however combined close to each other within a single component, there are several benefits. On the one hand, the distances over which the signals need to travel from one of the sub-circuits to the other can be made very short such that adverse impacts can be limited. On the other hand, one or more suitable impedance matching devices can be provided within the signal paths, the impedance matching devices being configured such as to provide an optimized transmission of the RF signals over the respective electrical connection, i.e., signal path. This way, the reliability of the interaction between the two sub-circuits can be further enhanced, particularly in the case where the interaction is based on RF signals.

According to some embodiments, the component is further configured to protect data to be communicated between the first and the second integrated sub-circuits over the signal connection by means of data encryption. This is particularly useful, if according to some embodiments discussed above, all connections between the first sub-circuit and the periphery of the component run through the second sub-circuit which thus plays the role of a gatekeeper. Encryption of the signal connection between the second and the first sub-circuits thus enhances the security concept based on this gatekeeper function in that it increases the difficulty of intercepting the signal path to and from the first sub-circuit and thus circumventing the second sub-circuit as a gatekeeper.

According to some embodiments, the second sub-circuit further comprises an access control functionality that is configured to monitor and control signals to be exchanged between with the component's periphery and the first sub-circuit based on predetermined access control rules. In this way, the gatekeeping function of the second sub-circuit may be further enhanced and the security of the operation of the first sub-circuit be further increased. Specifically, according to some embodiments the access control functionality of the second sub-circuit may be configured to selectively grant or dismiss an access request from a requesting entity of the component's periphery for receiving access to the interface of the first sub-circuit as a whole or to one or more individual signal paths thereof only based on a previous authentication of the requesting entity. In this way, it is also possible to implement different security levels for different types of access requests, and particularly also for different individual signal paths of the interface of the first sub-circuit.

According to some embodiments, the second-sub-circuit further comprises an energy-management functionality for managing the supply of energy to the first sub-circuit or parts thereof. The energy-management functionality is configured to perform—according to the following variants (i) through (iv)—one or more of the following energy control tasks in response to receiving a respective energy control signal: (i) selectively switch on or off the respective supply of energy to one or more selected circuit portions of the first sub-circuit and, if present, additionally of the one or more further functional circuits; (ii) selectively cause one or more selected circuit portions of the first sub-circuit to transition into a respective low-energy mode of operation; (iii) selectively reroute at least parts of a supply of total available energy to one or more selected portions of the first sub-circuit, such that the energy is made available only or predominantly to those selected portions, while the energy supply to non-selected portions is interrupted or reduced accordingly; (iv) selectively connect a reserve energy supply, a device or circuit configured to reduce the supply of energy, or an energy regulating circuit to a respective energy supply path of one or more selected portions of the first sub-circuit to achieve an increase, a reduction, or a regulation, respectively, of the supply of energy to the one or more selected portions of the first sub-circuit.

Where, according to related embodiments, the component comprises in addition to the first and second sub-circuits one or more further sub-circuits, each having a defined interface and a defined fixed-hardware functionality, the energy-management functionality of the second sub-circuit may be further configured to perform—according to the following variants (v) through (viii)—one or more of the following energy control tasks in response to receiving a respective energy control signal: (v) selectively switch on or off the respective supply of energy to the one or more further sub-circuits; (vi) selectively cause one or more of the one or more further sub-circuits to transition into a respective low-energy mode of operation; (vii) selectively reroute at least parts of a supply of total available energy to one or more selected ones of first sub-circuit and the further sub-circuits, such that the energy is made available only or predominantly to these selected sub-circuits while the energy supply to non-selected ones of the first and the further sub-circuits is interrupted or reduced accordingly; (viii) selectively connect a reserve energy supply, a device or circuit configured to reduce the supply of energy, or an energy regulating circuit to a respective energy supply path of one or more selected ones of the first sub-circuit or the further sub-circuits or selected portions thereof to achieve an increase, a reduction or a regulation, respectively, of the supply of energy to the one or more selected ones of the first sub-circuit or the further sub-circuits or selected portions thereof.

While the predominant effect of variants (i), (ii), (v) and (vi), which may particularly be used during normal operation of the component, is saving energy where and when such energy consumption is currently not needed, variants (iii), (iv); (vii) and (viii) are particularly relevant in emergency situations, where the necessary energy supply for the component as a whole is adversely affected and a prioritization of the remaining functionality to be maintained and ensuring such functionality as long as possible are key requirements. If, for example in the case of an automotive application, the component is responsible for controlling the functionality of the steering wheel of the vehicle, in a scenario of a malfunctioning of the energy supply, for example if the engine goes off and the battery supply is weak or even interrupted, variants (iii) and (iv) may be used to ensure that at least the steering capability, including for example electric power steering, of the steering wheel is maintained as long as possible, while other functions, such as user interfaces for controlling entertainment, telephony or air conditioning functions may be cut off from energy supply. Specifically, rather than just switching off the energy supply of portions of the component that implement functionality having a respective lower priority in the given scenario, the supply paths of these energy supplies may be rerouted such that they these energy supplies can now supply energy to those portions of the component, which are responsible for functionality having a higher priority which needs to be maintained in the given scenario.

According to related embodiments, the component itself is further configured to generate the energy control signal based on a measurement of a flow of electrical energy through one or more of the terminals or over one or more electrical connections between the second sub-circuit and the first sub-circuit. Thus, the component itself is capable of measuring or monitoring both electrical paths outside of the component, to which it is connected, and electrical paths between the first and the second sub-circuits and generate the energy control signal based on such measurements. In particular, the measurements may relate to measuring electrical current, voltage or impedance or ohmic resistance or any physical value depending from one or more of the foregoing. These measurements may particularly form the basis of an improved energy management for the whole system, to which the component pertains, e.g., a control unit for a vehicle, and an improved handling of detected errors and defects relating to the energy management. For example, if the measurement yields a result that indicates an unusually increased current drain at one or more of the components terminals or between some of them or in one or more energy supply paths or signal paths between the second sub-circuit and the first sub-circuit, this may be interpreted as a potential malfunctioning or defect and the flow of energy through component may accordingly be adjusted. Such adjustment may, for example, be achieved in that the electronic component is configured to additionally connect one or more current-limiting devices, e.g., devices acting as resistors, into the respective paths, in order to limit the current and thereby prevent consequential malfunctioning or defects caused by said unusually increased current level.

Another measure to mitigate risks associated with the detected high current level may be to switch-off relevant portions of the component itself, e.g. selected FPGA areas or cells within the second sub-circuit, or to provide a control signal at one or more of the terminals of the component to cause one or more relevant portions of the overall system, to which the component pertains, to be switched-off or transitioned into another mode of operation, e.g. a low-power mode of operation. On the other hand, if the measurement result indicates that there is an insufficient supply of electrical energy, additional energy sources (e.g., a reserve power supply) or energy regulation means may be connected to the respective energy path in order to mitigate the risk that consequential malfunctions or defects might adversely affect the operation and reliability of the component or the system as a whole.

According to some embodiments, which may be implemented in the alternative or cumulatively, the energy-management functionality is further configured to: (i) receive the energy control signal in the form of an application-specific energy control signal from a host in the periphery of the component, when the host is executing a corresponding application program; (ii) determine, based on said energy control signal, one or more of said energy control tasks and sub-circuits or portions thereof to be impacted by such one or more tasks; and (iii) perform said determined one or more energy control tasks in relation to said determined one or more sub-circuits or portions thereof. These embodiments are particularly helpful, if it is desirable to extend the range of available different energy modes of the component, because in addition to a set of energy modes, which might be already available based on the hosts hardware itself, additional application-specific energy modes may be implemented on software level. Accordingly, the energy control signal may particularly indicate such an application-specific energy mode, which the application program running on the host wants the component to transition to, and the second sub-circuit may react accordingly and transition the component to that desired energy mode, which may or may not be different from an energy mode that the host hardware itself originally supports.

According to some embodiments (hereinafter referred to as "multi-chip embodiments"), the electronic component comprises a first integrated circuit device comprising the first sub-circuit and a second integrated circuit device comprising the second sub-circuit. Furthermore, the first and second integrated circuit devices are arranged in one of the following manners: (i) a single package contains both the first and the second integrated circuit devices (system-in-package, SIP); (ii) each of the first and second integrated circuit devices comprises an own package and the respective packages of the first and second integrated circuit devices are stacked atop each other (package-on-package, PoP); (iii) the first and second integrated circuit devices are each connected to a common interconnect substrate, e.g. within a multi-chip module (MCM) or to a printed circuit board (PCB), wherein the second integrated circuit device is provided on the PCB or embedded therein, at least partially, within a recess of the common interconnect substrate.

Specifically, according to some of these multi-chip embodiments, the first and second integrated circuit devices are arranged together with one or more further integrated circuit devices in one of the following manners: (i) a single package contains the first, the second, and the one or more further integrated circuit devices; (ii) each of the first, the second, and the further integrated circuit devices comprises an own package and the respective packages of all of these integrated circuit devices are stacked atop each other; (iii) the first, the second, and the further integrated circuit devices are each connected to a common interconnect substrate, wherein the second integrated circuit device is embedded, at least partially, within a recess of the common interconnect substrate. Optionally, one or more of the other integrated circuit devices may be similarly embedded as well.

All of these respective variants (i) through (iii), although each in a different manner, allow for the integration of the first and the second and optionally further sub-circuits in the form of integrated circuit devices within a same single discrete component. Such a design also has the benefit that if one or more of the sub-circuits need to be exchanged, e.g., in the course of switching to a new product generation, the overall design of the component may substantially remain the same, including in particular its pinout, while only the one or more sub-circuits to be updated, i.e. replaced by a next-generation sub-circuit, can be introduced instead of the previous version. Furthermore, the second sub-circuit may be designed as a reusable circuit such that it can be combined with a variety of different first sub-circuits and all of these variants allow for an easy integration of such a second sub-circuit on packaging level, i.e., after the respective semiconductor manufacturing process, into different components having a respective one of the more of such different first sub-circuits.

According to some alternative embodiments (hereinafter referred to as "SOC embodiments"), the first sub-circuit, the second sub-circuit and the signal connection therebetween are integrated together in a single system-on-chip, SOC. In this case, the first sub-circuit, the second sub-circuit and optionally further sub-circuits, may specifically each form a semiconductor IP core, all of which are integrated together on the same semiconductor substrate, thus forming a SOC. These embodiments provide the benefit of a very high level of integration and reliability because the whole functionality is implemented within a single semiconductor substrate with no need of interfacing between different materials, such as semiconductor die and PCBs or other common substrates or packages.

This allows for using the benefits of both predetermined fixed-hardware circuitry and flexible, i.e., reprogrammable circuitry. While the fixed-hardware circuitry may typically be implemented at a very high level of integration and thus high performance and space efficiency (small form factor and low cost), the flexibility that may be provided specifically in the second sub-circuit forms the basis of a lot of different advanced functionalities of the overall SOC, as will be described in detail below in relation to various embodiments.

According to some of these SOC embodiments, the signal connection between the first and the second integrated sub-circuits comprises one or more dedicated measurement lines that are configured exclusively for testing, measuring, or monitoring the first sub-circuit or its functionality at respective predetermined measurement points within the first sub-circuit without controlling or otherwise influencing said functionality. This allows for highly reliable and specific measurements of specific states or functionalities of the first sub-circuit, in particular including states or functionalities that are otherwise not accessible via of the ordinary interface of the first sub-circuit. This also extends the scope of testing that the component can perform itself. For example, such measurements may include measuring local currents and voltages and related or derivable values, such as local temperatures, resistances etc. deep inside the first sub-circuit at critical locations that do not have any direct other connection to the outside world, e.g., the interface of the first sub-circuit.

In some of these SOC embodiments (hereinafter referred to as "granular embodiments") the SOC comprises: (i) a first sub-circuit having a defined interface and a defined fixed-hardware functionality; (ii) a second reconfigurable sub-circuit being signal-connected via the interface to the first sub-circuit to exchange signals therewith; and (iii) one or more terminals for electrically connecting the SOC to its periphery. The second sub-circuit is configured as an interface circuit between the one or more terminals and the first sub-circuit. The first sub-circuit is split into a plurality of individual first circuit blocks and the second sub-circuit is split into a plurality of individual second circuit blocks. Furthermore, at least one of said first circuit block is signal-connected via one or more signal connections, each running through one or more of the second circuit blocks, to one or more other first circuit blocks or one or more of the terminals. One or more of said signal connections are reconfigurable, for example dynamically and/or reversibly, by means of the respective one or more second circuit blocks pertaining to the respective signal connection, such that the SOC is reconfigurable before or during its operation by way of reconfiguring at least one of said second circuit blocks.

The overall structure of these granular embodiments provides a reconfigurable interconnection structure on the one hand between the various individual fixed-hardware circuit blocks, such that their respective functionalities and features can be dynamically combined in a plurality of different ways depending on current application-specific and operational requirements of the SOC, and on the other hand between these first circuit blocks and the SOC's terminals and thus the periphery of the SOC.

Although the design layout of the first sub-circuit is split up in the plurality of individual first circuit blocks, each implementing one or more specific functionalities of the first sub-circuit, the overall functionality of the first sub-circuit, which may particularly correspond to one or more reusable semiconductor IP cores, is maintained.

A further benefit of the granular embodiments is that the configuration of the terminals of the SOC, i.e., its pinout, may remain constant over multiple versions or even generations of the SOC although these different versions or generations contain different versions of at least the first sub-circuit, the interface of which may even change from version or generation to version or generation, respectively.

According to some of the granular embodiments, the SOC is adapted to dynamically reconfigure itself during its operation by reconfiguring said at least one second circuit block based on a machine-learning based reconfiguration process. Specifically, in some related embodiments, the SOC is adapted to apply the machine-learning based reconfiguration process for dynamically determining for a current or upcoming operational scenario of the SOC a respective optimized configuration among a set of multiple possible configurations of two or more of said second circuit blocks in dependence of the values of one or more input parameters defining that operational scenario. Accordingly, in this way the interconnection structure of the SOC that is provided by the set of second circuit blocks can be automatically adapted to specific operational scenarios and thus requirements the SOC needs to meet. Those operational scenarios may particularly relate to application-specific requirements or to operational requirements of the SOC itself, e.g., thermal management, self-testing etc.

Thus, the input parameters may correspond to technical parameters characterizing these respective requirements. For example, in the case of operational requirements, the input parameters may reflect measurement results of a self-test, e.g., a temperature distribution across the SOC or current or voltage levels at particular locations within the SOC. In the case of application-specific requirements, the input parameters may for example reflect a set of different current priorities allocated to different ones of the functionalities of the first sub-circuit, or the SOC as a whole, such that the SOC can configure the interconnection structure such that circuits block having a low priority are disconnected or transitioned into a low-power mode, while circuit blocks having a higher priority remain connected. In particular, this may be performed in a way that first circuit blocks which need to collaborate in order to perform a certain application-specific become or remain interconnected through one or more intermediate second circuit blocks. Using one or more machine-learning based reconfiguration processes enables a solution, that is capable of self-adapting to a broad range of operational scenarios including operational scenarios that have not been foreseen at the time of the design of the SOC or operational scenarios which are changing over time, e.g., based on an aging process of the SOC itself or of its periphery.

According to some granular embodiments, a first subset of the second circuit blocks is implemented as a respective fixed-hardware circuit block and a disjoint second subset of the second circuit blocks is implemented as a respective reconfigurable circuit block, e.g., an FPGA block. In this way, the functionality of the second sub-circuit itself is based on the concept of mixing hardwired, i.e., fixed-hardware, circuit blocks, and reconfigurable circuit blocks. For example, a library of different predefined functionalities of the second sub-circuit, may be implemented by the set of hardwired second circuit blocks, each implementing one or more library elements, while the reconfigurable second circuit blocks provide an interconnection structure within the second sub-circuit itself that allows to flexibly interconnect second circuit blocks among each other and particularly to switch on or off individual library elements depending on a current operational scenario applying to the second sub-circuit.

A second exemplary aspect is directed to an electronic system, such as a system-in-package (SIP), or a multi-chip module (MCM), or a common circuit board comprising two or more components mounted thereon or embedded therein, the system comprising (i) a component according to any one of the multi-chip-embodiments described herein and (ii) a component according to any one of the SOC embodiments described herein, and (iii) one or more terminals for electrically connecting the system to its periphery.

Such a system may have the benefit that the respective strengths of both types of embodiments, multi-chip and SOC, can be used at the same time in a suitable partitioning. Particularly, components of the system, for which it is possible that the respective second sub-circuit is integrated on the same semiconductor die as the first sub-circuit, for example if RF signals need to be exchanged between the two sub-circuits, can be for example provided as an SOC embodiment, while other components of the system, and particularly those where the manufacturing technology for the second sub-circuit needs to be substantially different from the manufacturing technology for the first sub-circuit or where frequent product updates are expected and necessary, might for example be provided as a multichip embodiment. For example, if the second sub-circuit is not limited to a logic design but further comprises power circuitry or significant memory circuitry, its manufacturing technology might have to be significantly different from that of the first sub-circuit, which may for example only require standard CMOS technology, and thus an implementation according to the multichip embodiments will be necessary or at least preferable.

Where the term "comprising" is used in the present description and claims, it does not exclude other elements or steps. Where an indefinite or definite article is used when referring to a singular noun e.g., "a" or "an", "the", this includes a plural of that noun unless something else is specifically stated.

The terms first, second, third and the like in the description and in the claims, are used for distinguishing between similar elements and not necessarily for describing a sequential or chronological or spatial order. It is to be understood that the terms so used are interchangeable under appropriate circumstances and that the embodiments described herein are capable of operation in other sequences or orders than described or illustrated herein.

Many of the functional units described in this specification have been labelled as devices, in order to more particularly emphasize their implementation independence. For example, a device may be implemented as a hardware circuit comprising custom VLSI circuits or gate arrays, off-the-shelf semiconductors such as logic chips, transistors, or other discrete components. A device may also be implemented in programmable hardware means such as field programmable gate arrays, programmable array logic, programmable logic means or the like.

Reference will now be made to the drawings in which the various elements of embodiments will be given numerical designations and in which further embodiments will be discussed.

Specific references to components, process steps, and other elements are not intended to be limiting. Further, it is understood that like parts bear the same or similar reference numerals when referring to alternate FIGS. It is further noted that the FIGS. are schematic and provided for guidance to the skilled reader and are not necessarily drawn to scale. Rather, the various drawing scales, aspect ratios, and numbers of components shown in the FIGS. may be purposely distorted to make certain features or relationships easier to understand.

Referring to FIG. 1, an electronic component 1 according to an embodiment comprises a first sub-circuit 2 with a fixed-hardware functionality, for example a microcontroller, implemented in a logic design 2a, and a reconfigurable second sub-circuit 3. The electronic component 1 as a whole is a discrete electronic device and has a set of terminals 4 for connecting the component 1 to its periphery, such as a printed circuit board of an apparatus, e.g., an electronic control unit (ECU) an automotive application, such as for example engine control, air conditioning control, and infotainment system, an electronic power steering system, or a braking system, and so forth.

Each of the terminals 4 of component 1 is electrically connected to respective pads 5 pertaining to the second sub-circuit, while there is no direct connection of the first sub-circuit 2 to any one of the terminals 4. Accordingly, the second sub-circuit 3 acts as an interface circuit and gatekeeper for the first sub-circuit 2, because the latter may only be accessed from the terminals 4 and thus the periphery of the component 1 through the second sub-circuit 3. Each of the first and second sub-circuits comprises a set of respective different and interconnected circuit blocks. However, for the sake of reducing the complexity of the illustration, those inter-block connections and internal circuitry of the various blocks have not been drawn in the figures, unless for selected ones where a specific reference is made thereto in the following discussion of various embodiments.

For example, in view of the gatekeeper function of the second sub-circuit 3 in relation to the first sub-circuit 2, the communication over the signal lines 6 is protected by means of data encryption in order to prevent tampering with the component 1, e.g. with the objective of circumventing the gatekeeper function and getting, in spite of missing authorization, direct access to the first sub-circuit, e.g. for illegal car tuning purposes. Furthermore, the second sub-circuit 3 may comprise an access control functionality provided in a corresponding functional block 3e, in order to implement an authentication procedure, such that access to the first sub-circuit 2 from the component's periphery via one or more of the terminals 4 is only possible upon successful authentication.

The second sub-circuit 3 is particularly designed as a testing unit for testing the hardware functionality, in particular the logic design 2a, of the first sub-circuit 2 (which may thus be referred to as a device or design under test, DUT) by applying by an interface block 3d of the second sub-circuit 3 one or more input signals over a set of signal lines 6 to an interface 2b of the first sub-circuit 2 and evaluating one or more output signals received in return via the interface 2b from the first sub-circuit 2 in response to the one or more input signals for conformance with one or more predetermined test criteria. Interface 2b may be as simple as comprising only electrical contact points for connecting the second sub-circuit 3 to the first sub-circuit 2, or it may have higher complexity and also comprise one or more interface functionalities, e.g. I/O functionality like voltage limiters, charge pumps, signal filters etc.

Such test criteria may include, for example, whether (i) a measured potential is below or above a predefined voltage threshold, (ii) a measured current is below or above a predefined current threshold, (iii) a local temperature is below or above a predefined temperature threshold, or (iv) a signal frequency is below or above a predefined signal threshold. Specifically, signal lines 6 that are designed to carry high frequency signals, such as radiofrequency (RF) signals, may comprise specific impedance matching devices 7 in order to optimize the transmission of such high-frequency signals over the respective signal lines without unacceptable dampening or other adverse frequency-dependent effects. Other possible test criteria may relate to other measurable properties and operational states of the first sub-circuit 2.

In addition to regular signal lines 6 running between the interface block 3d of the second sub-circuit and the interface 2b of the first sub-circuit, specific dedicated measurement lines 6a, 6b and 6c may run between the interface block 3d and selected measurement locations within the logic design 2a of the first sub-circuit 2. This allows for in situ measurements at those selected locations without affecting the functionality of the first sub-circuit 2.

The selected locations may particularly relate to portions of the first sub-circuit 2 that are subject to superior stress, e.g. because of above-average currents, voltages, temperatures or frequencies.

While the measurement may be a one-time measurement, which may for example be performed only upon booting the component, it may alternatively take place on a regular basis, for example in fixed time intervals or in specific predetermined situations. Furthermore, a substantially continuous monitoring is possible, which may be particularly useful for safety relevant applications.

The functionality, including in particular the test functionality, of the second sub-circuit 3 is based on a set of functional blocks of the second sub-circuit 3, including a reprogrammable block, for example in the form of a field programmable gate array (FPGA), a controller block 3b, a memory block 3c, e.g. in the form of embedded flash memory, the interface block 3d and access control block 3e. In addition, the second sub-circuit 3 may comprise other blocks (not drawn) as well.

Specifically, the controller block 3b may have a number of different functions, including, on the one hand, controlling the measurements in relation to the first sub-circuit 2, as discussed above. On the other hand, the controller block 3b is configured to evaluate the obtained measurement results and react accordingly in order to maintain the desired functionality of the first sub-circuit 2 and thus the component 1 is a whole. To that purpose, the second sub-circuit 3 may be adapted to control or feedback-control the first sub-circuit 2 or parts thereof, such as specific circuit blocks relating to specific functionalities of the first sub-circuit 2. For example, the controller block 3b may control signals being exchanged over signal lines 6 between the second and the first sub-circuits and change them or switch them on and off in dependence from the measurement results obtained.

Furthermore, if the measurement results indicate a defect in the first sub-circuit 2 in relation to a particular functionality thereof, the controller block 3b may initiate a substitution of that defect functionality of the first sub-circuit 2 by a corresponding functionality of the second sub-circuit, which may particularly be implemented in the reprogrammable (FPGA) block 3a of the second sub-circuit 3. To that purpose, the controller block 3b may load a corresponding program pattern from the memory block 3c where it had been previously stored as an element of a library containing a set of different program patterns for different purposes.

Alternatively, controller block 3b may communicate a respective program pattern for fixing the defect to a dedicated reprogrammable functional block 2h of the first sub-circuit 2 itself, if such block 2h is present and the defect can be allocated to that reprogrammable block 2h. Specifically, that reprogrammable block 2h may itself define a test functionality, e.g., a boundary scan functionality, of the first sub-circuit 2 itself. Accordingly, if the test functionality has been found to be malfunctioning or otherwise defective, it can be fixed by reprogramming block 2 based on a program pattern provided by the second sub-circuit 2 in response to detecting the malfunctioning or defect error detection functionality of the component 1, which might be implemented in any one of the first and second sub-circuits 2 or 3, respectively, or even elsewhere within the component 1.

Furthermore, in addition to its test functionality, the second sub-circuit 3 comprises an energy management block 3f for managing the energy supply of the first sub-circuit 2. Specifically, the first sub-circuit 2 comprises within its logic design 2a exemplary first, second and third functional blocks 2f, 2g and 2h in the form of circuit blocks. Each of these circuit blocks has a corresponding energy supply block 2c, 2d and 2e, respectively, which may particularly be any integrated current or voltage sources, such as for example voltage regulators or charge pumps or simply a switching circuit or device, e.g. a transistor, capable of selectively connecting or disconnecting the respective functional block with a power input or other energy supply of the logic design 2a or of the first sub-circuit 2 as a whole.

The first sub-circuit 2 may particularly receive its power supply from the second sub-circuit 3 over respective power supply lines 9 running between the two sub-circuits. As shown in FIG. 1, these power supply lines 9 may be connected to said energy supply blocks 2c, 2d and 2e, which in turn can switch on or off, regulate or boost or reduce the power supply of the corresponding functional blocks 2f, 2g and 2h of the first sub-circuit 2 in response to respective control signals received from the energy management block 3f of the second sub-circuit 3. Specifically, in order to reduce the necessary power supply for those functional blocks, one or more of them may be selectively transitioned into a low-power mode of operation, such as a sleep mode, if their functionalities are currently not needed or, in a scenario of insufficient overall power supply, have lower priority than other functionalities that need to be maintained in the course of an emergency mode.

The second sub-circuit 3, in turn, may receive its power from a primary energy supply 8a within the component. Primary energy supply 8a may correspond to one or more power input terminals 4 of the component 1 or to an energy supply unit within the component 1, such as a voltage regulator or charge pump or other circuit for supplying electrical energy. In addition, component 1 may comprise a reserve energy supply 8b which is not used during normal operation of the component 1 but is instead used as a backup energy supply for supporting an emergency functionality of the component 1 if the primary energy 8a supply breaks away or becomes otherwise unreliable or insufficient.

Accordingly, in such a situation, the energy management block 3f may have a functionality to selectively direct energy from the reserve energy supply 8b only to those high prioritized functional blocks of the component 1, including in particular respective high prioritized circuit blocks of the first sub-circuit 2. In addition, energy management block 3f may selectively reroute at least parts of the energy being supplied by the primary energy supply 8a or the reserve energy supply 8b, as the case may be, in order to ensure, that the energy is solely, or at least primarily provided to those functional blocks within component 1, which have the highest priority in a given scenario.

For example, if in the case of an automotive application, e.g., engine control, the primary energy supply 8a fails, energy management block 3f may selectively connect reserve energy supply 8b to selected functional blocks of component 1 and particularly first sub-circuit 2 that are necessary to maintain an emergency functionality of the engine, which is for example sufficient to pull the vehicle to the side of the road before the engine goes off. In addition, if the primary energy supply 8a has not fully ceased to provide energy, energy management block 3f may reroute the flow of energy from the primary energy supply 8a by disconnecting lower prioritized functional blocks from the energy supply and directing the flow of energy instead to the higher prioritized functional blocks needed in said emergency scenario. Accordingly, those higher prioritize functional blocks may not only receive their regular energy supply, but they may even be supplied with additional energy in order to safeguard their functionality in a given scenario.

The rerouting may also be used in other, non-emergency scenarios, if at least temporarily an extra amount of energy is necessary. This may for example be the case, if component 1 comprises a flash memory and a flashing (erasing) operation needs to be performed which temporarily consumes above-average energy above a level that the standard energy supply of that flash memory can provide.

Figure 2:
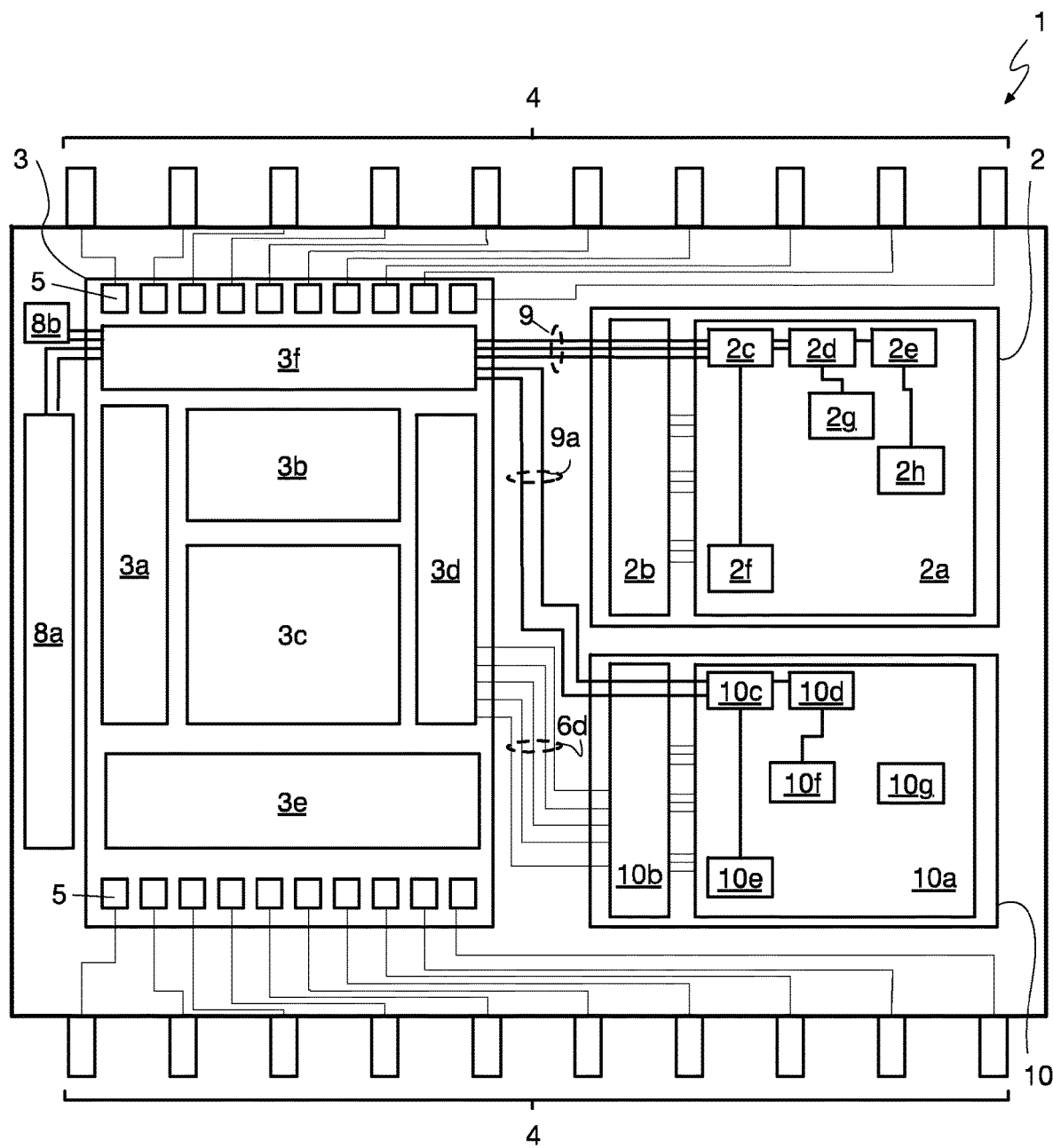
FIG. 2 schematically illustrates a block diagram of another exemplary embodiment of an electronic component with a first, a second and a third sub-circuit.

FIG. 2 shows another embodiment of an electronic component 1. This embodiment is based on the embodiment of FIG. 1 and contains all of its features. It differs, however, from the embodiment of FIG. 1, in that the component 1 comprises a further sub-circuit 10, hereinafter referred to as a third sub-circuit, which as yet another functionality to the component 1 and is a further DUT comprised therein. Accordingly, the second sub-circuit 3 is adapted to not only perform its control, test, energy management, access control and other functions, as described above with reference to FIG. 1, in relation to the first sub-circuit 2 (DUT1), but also for the third sub-circuit 10 (DUT2) and in a similar manner. Of course, the number of DUTs is not limited to two and accordingly further sub-circuits (DUTs) may be present as well.

The third sub-circuit 10 comprises, in a similar manner as the first sub-circuit 2, a functional logic design 10*a* including various sub-blocks, such as by way of example sub-blocks 10*e*, 10*f*, 10*g*, and an interface 10*b* for interfacing with the second sub-circuit 3 over signal lines 6*a* and power lines 9*a* (the signal lines 6 of the first sub-circuit 2 have not been drawn in FIG. 2). The logic design 10*a* further comprises energy supplies 10*c* and 10*d*, which are controllable, in a similar manner as energy supply blocks 2*c*, 2*d* and 2*e* of the first sub-circuit 2, by control signals received from the second sub-circuit 3 over one or more of signal lines 6*a* and the interface 10*b*. Sub-block 10*g*, however, is an example of a sub-block that does not have an individual controllable energy supply under the control of the second sub-circuit. For example, sub-block 10*g* may relate to a principal key functionality of the logic design 10*a* which has to be powered in any case for maintaining the usability of the third sub-circuit 10 or even the component 1 as a whole and thus has no need of being selectively deactivated or put into a low power mode.

The physical structure of electronic component 1 may be defined in various different ways, including those illustrated in FIGS. 3A to 3G. In each case, the embodiments presented in these figures relate to component designs having a first and a second sub-circuit 2 and 3, respectively, while the embodiment of FIG. 3E comprises in addition three further sub-circuits (DUTs) 10, 10' and 10". Particularly, the principal embodiments of FIGS. 1 and 2 may be used in connection with each of the structural embodiments of FIGS. 3A and 3G.

Figure 3A:
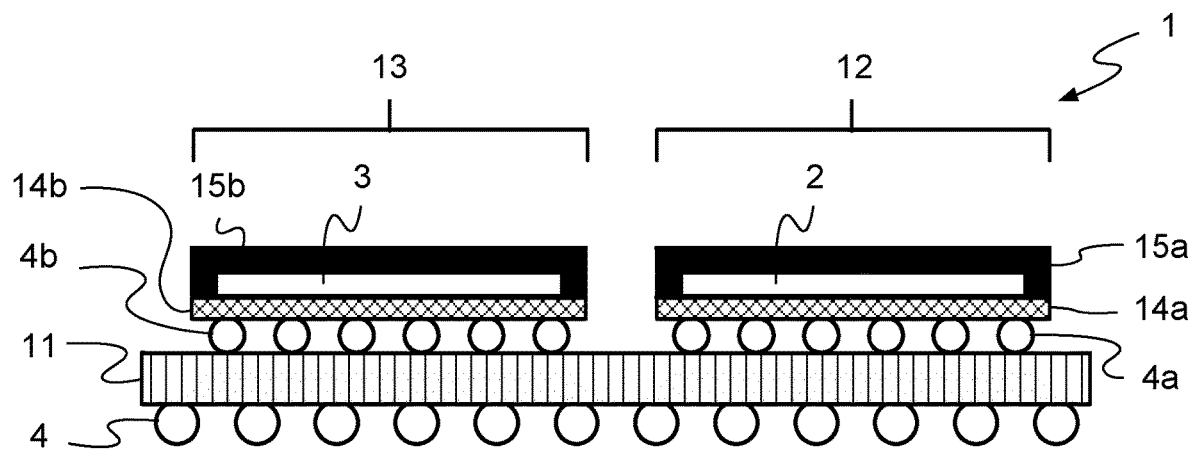
FIGS. 3A-3G cross-sectional views of various different embodiments of an electronic component.

FIG. 3A shows a component design according to a first structural embodiment of a component 1, where each of the first and second sub-circuits 2 and 3, respectively, is defined as an individual packaged integrated circuit. Specifically, the first sub-circuit 2 is a semiconductor chip comprising integrated circuit, which may for example comprise components 2*a* through 2*g*, as discussed with reference to FIG. 1 above. This chip may, for example, be mounted on a package substrate 14*a* of a ball grid array (BGA) package having solder balls as package terminals 4*a* and a mold mass 15*a* for encapsulation of the chip, thus forming an individual packaged integrated circuit 12. Similarly, the second sub-circuit 3 may be integrated in another individually packaged integrated circuit 13 comprising the second sub-circuit 3 in an integrated circuit die, a package substrate 14*b* having terminals 4*b*, and a chip encapsulation formed by a mold mass 15*b*. In order to form component 1 in the form of a multi-chip module (MCM), packaged integrated circuits 12 and 13 are mounted on a common component substrate 11 (MCM substrate), which in turn has a set of terminals 4, which may for example again be of the ball grid array (BGA) type (or any other suitable type), in order for the component 1 to be able to be connected to its periphery, such as a printed circuit board (PCB) of a system into which component 1 is to be integrated.

Figure 3B:
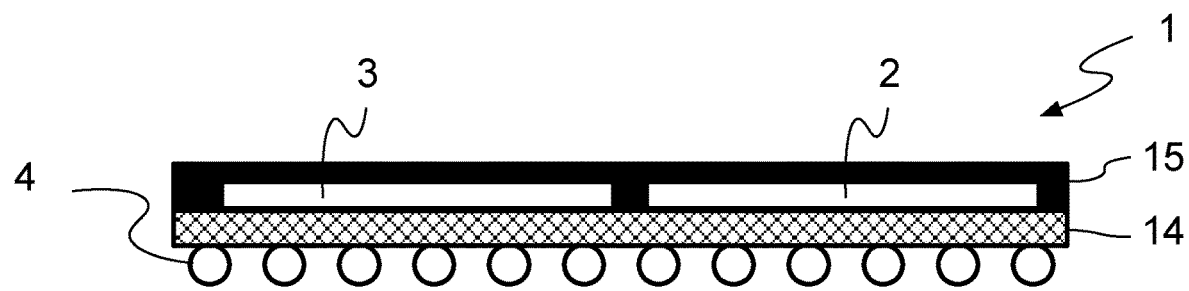

FIG. 3B shows a second structural embodiment of a component 1, where again the first sub-circuit 2 and the second sub-circuit 3 are each defined as individual integrated semiconductor chips (ICs). However, in contrast to the embodiment of FIG. 3A, these two chips 2 and 3 share a common package and are to that purpose mounted on a common package substrate 14 having terminals 4. The two chips 2 and 3 are also embedded in a common mold mass 15 and thus encapsulated together. Accordingly, embodiment 3B relates to a system-in-package (SIP) comprising chips 2 and 3 as individual, yet commonly packaged components.

Figure 3C:
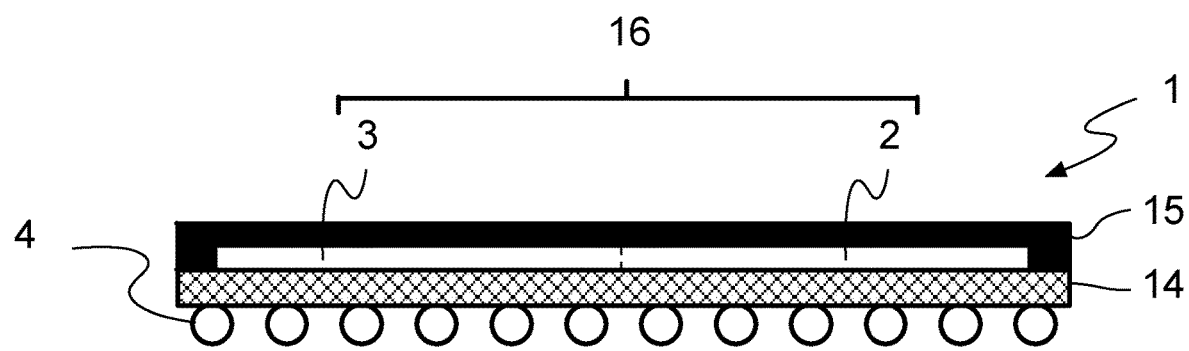

FIG. 3C shows a third structural embodiment of a component 1, where in contrast to the first and second embodiments, the two sub-circuits 2 and 3 are integrated on a same semiconductor die 16 (chip) being packaged in a single package, thus forming a system-on-a-chip (SOC). Particularly, chip 16 may comprise one or more semiconductor IP cores, optionally even from different vendors, such as for example microprocessor or interface cores.

Figure 3D:
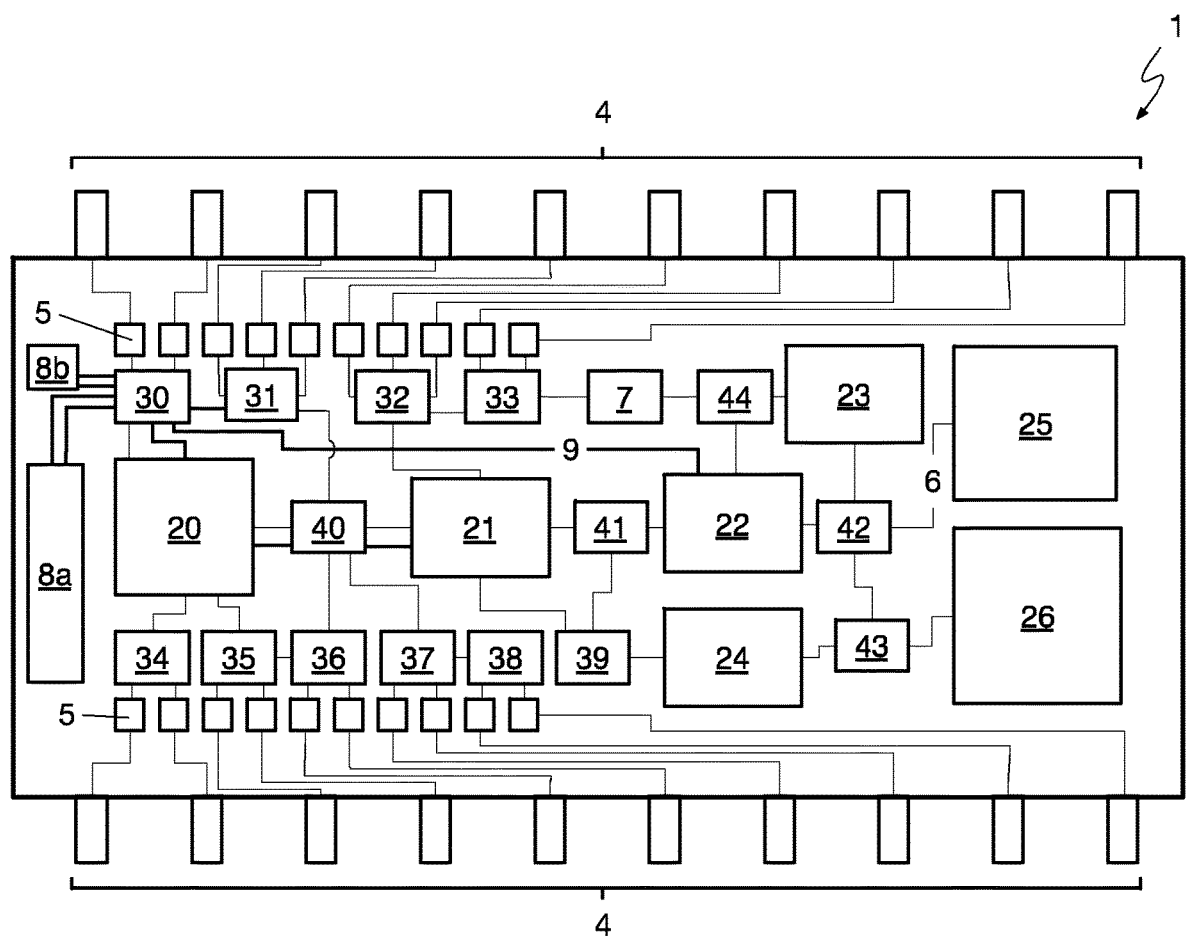

FIG. 3D shows fourth structural embodiment of a component 1, which is a specific form of the SOC-embodiment of FIG. 3C. Specifically, here the SOC 1 comprises a semiconductor substrate having integrated thereon a first sub-circuit 2, which is distributed across a set of exemplary individual first circuit blocks 20 to 26, and a second sub-circuit 3, which is distributed across a set of exemplary individual second circuit blocks 30 to 44. The first circuit blocks 20 to 44 are distributed across the layout of the SOC 1 and interconnected in such a way that each first circuit block is signal-connected via one or more signal connections 6 (only one of which is marked with the reference sign 6), each running through one or more of the second circuit blocks 30 to 44, to one or more other first circuit blocks 20 to 26 or one or more terminals 4 of the SOC 1. Moreover, one or more of said signal connections 6 are reconfigurable, for example dynamically and reversibly, by means of the respective one or more second circuit blocks 30 to 44 pertaining to the respective signal connection 6, such that the SOC 1 is reconfigurable during its operation by way of reconfiguring at least one of said second circuit blocks 30 to 44.

Accordingly, in this exemplary embodiment of FIG. 3D, there is no direct connection between any one of the first circuit blocks 20 to 26 and a pad 5 respectively a terminal 4 connected thereto, and thus the periphery of the SOC 1. Any connection between one of the first circuit blocks 20 to 26 and a terminal 4 of SOC 1 runs through at least one of the second circuit blocks 30 to 44, which thus collectively provided gatekeeper function for the first sub-circuit 2. It is noted, however, that in other embodiments, there may be in addition one or more direct connections between a first circuit block and one or more other first circuit blocks and/or one or more of the terminals.

While all of the circuit blocks or connectable (most connections not drawn) directly or indirectly to a primary power supply 8a of the SOC 1, at least a subset comprising one or more of the second circuit blocks, in the present example circuit blocks 30 and 31, comprises an energy management function for at least a subset of the first circuit blocks, in the present example circuit blocks 20 to 22, as discussed in detail above. To that purpose, the circuit blocks 30, 31 are connected, directly or indirectly to the primary power supply 8a on the one hand and are designed to selectively connect each of blocks 20 to 22 via respective power lines 9 to at least one of the primary power supply 8a and an additional reserve power supply 8b, or disconnect them therefrom. Each of power supplies 8a and 8b may be on-chip, e.g., in the form of a voltage regulator or charge pump or any other kind of voltage source or current source or alternatively off-chip and connectable through a subset of terminal 4 to respective power lines on SOC 1.

Figure 3E:
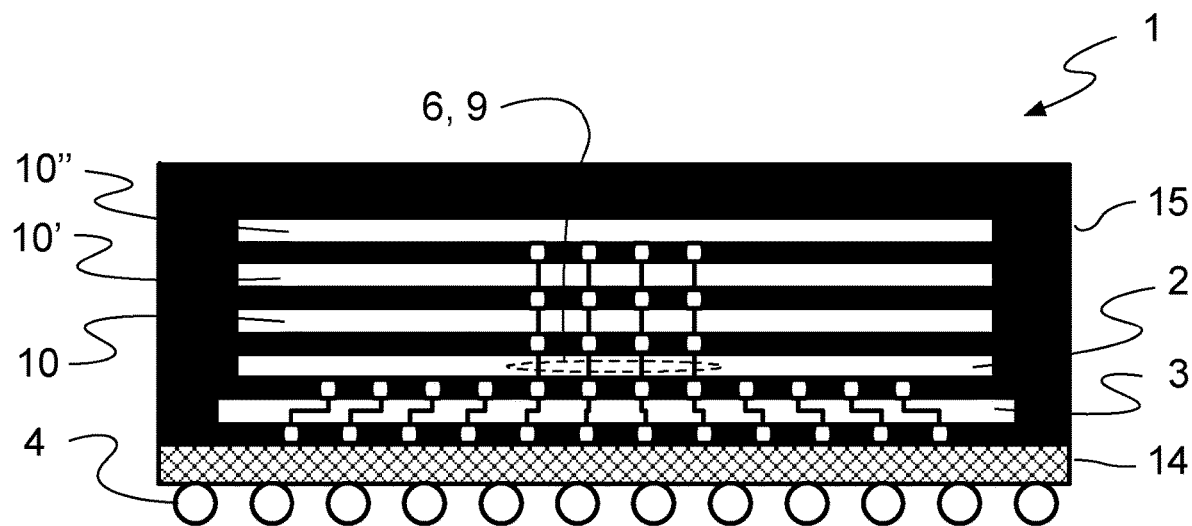

FIG. 3E shows a fifth structural embodiment of a component 1, where the second sub-circuit 3, the first sub-circuit 2 ($1^{st}$ DUT) and three further sub-circuits 10, 10' and 10" ($2^{nd}$ to $4^{th}$ DUTs) are stacked atop each other such that the second sub-circuit 3 forms the lowest layer of that stack. The stack, which thus comprises a total of five different integrated circuits, is provided in a single package comprising a package substrate 14 with terminals 4 and a mold mass 15 for encapsulation of the whole stack. Accordingly, the embodiment of FIG. 3D is yet another variant of a system-in-package (SIP). The first sub-circuit 2 may for example be a logic circuit, while the further sub-circuits 10, 10' and 10" may for example be memory devices. The second sub-circuit 3 provides, amongst others, a testing functionality for each of the chips 2, 10, 10' and 10", as described above, e.g., with reference to FIGS. 1 and 2.

Figure 3F:
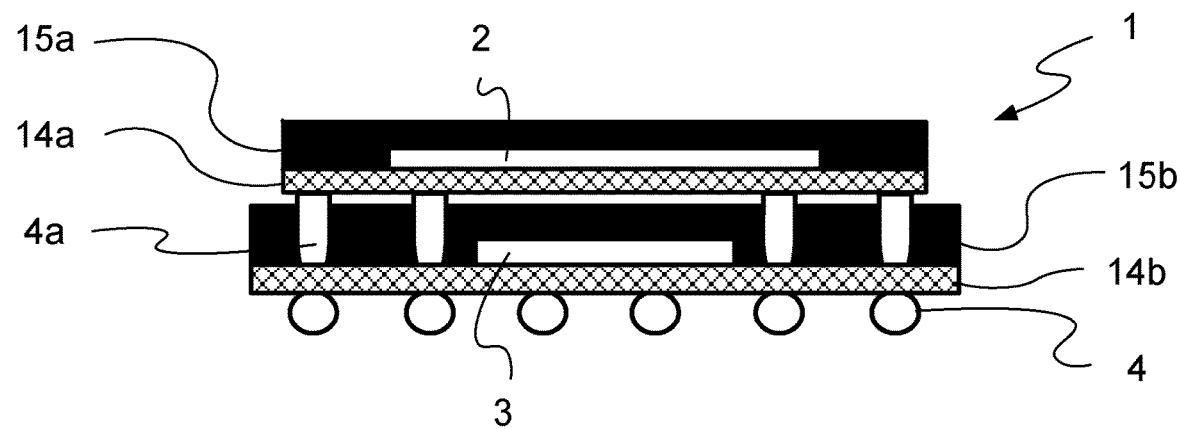

FIG. 3F shows a sixth structural embodiment of a component 1, where like in the embodiment of FIG. 3A, each of the first and second sub-circuits 2 and 3 is provided as a packaged device having a respective package substrate 14a or 14b and a respective molded encapsulation 15a or 15b, respectively. However, in contrast to the embodiment of FIG. 3A, here the two packages are laterally arranged next to each other on a common substrate but are instead stacked atop each other to form a package-on-package (PoP) structure. Again, depending on the implementation, the second sub-circuit 3 may play the role of a gatekeeper of the first sub-circuit such that the first sub-circuit 2 can only be accessed through the second sub-circuit 3. In other implementations, it is however possible that at least a subset of the terminals 4a of the package of the first sub-circuit 2 are directly connected to respective terminals 4 of the PoP-structure.

Figure 3G:
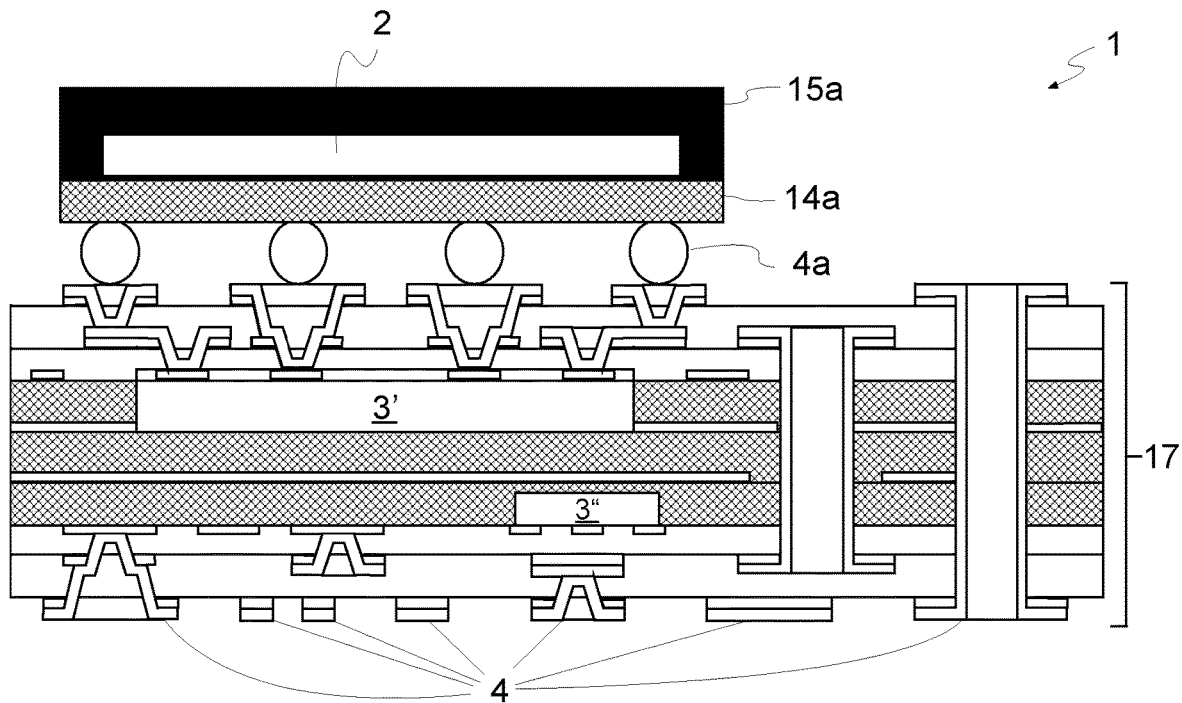

FIG. 3G shows a seventh structural embodiment of a component 1, where the component 1 comprises a multi-layer circuit board 17 (PCB) as a common substrate on which the first sub-circuit 2 (1st DUT) in the form of a package device is mounted. Accordingly, the terminals 4 of component 1 are provided on the PCB 17 itself. In addition, one or more further DUTs 10, 10' etc. (not drawn) may also be mounted to the PCB as further elements of component 1. Furthermore, component 1 comprises two (or more) second sub-circuits 3' and 3". Each of these second sub-circuits comprises a test functionality and optionally further functionalities to be applied in relation to one or more of the DUTs, as described in detail above. In particular, there may be a one-to-one correspondence between a respective DUT and a corresponding second sub-circuit 3' or 3". Specifically, one or more of the second sub-circuits 3' or 3" may be provided in a respective recess in the PCB 17, which allows for particularly compact implementations. Optionally (not drawn), also one or more of the DUTs 2, 10, etc. may be located in a respective recess within PCB 17.

Figure 4:
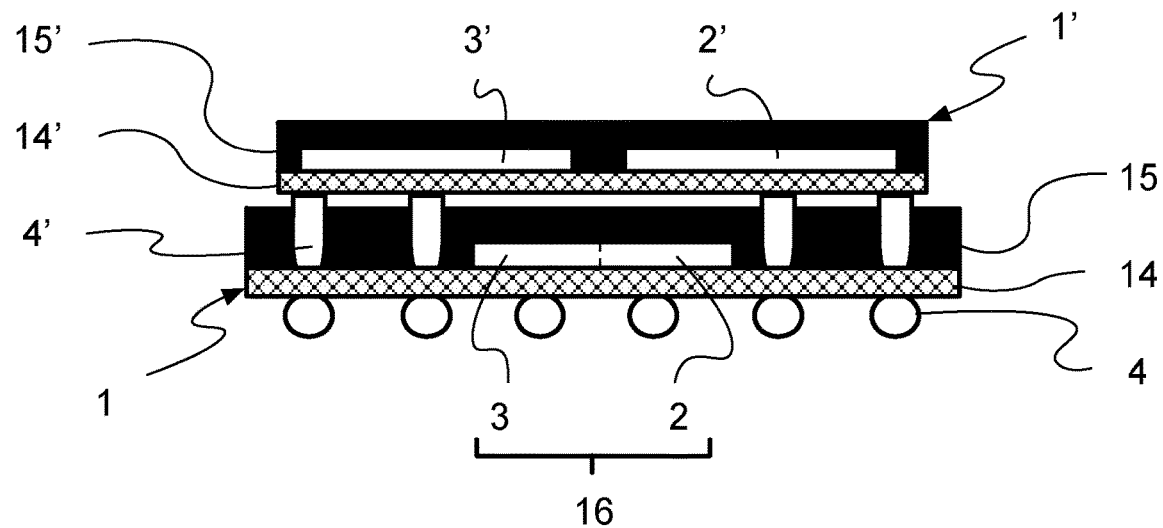
FIG. 4 a cross-sectional view of an exemplary embodiment of a system comprising two different electronic components according to FIG. 3B and FIG. 3C, respectively.

Referring to FIG. 4, two or more of the components 1, for example a first component 1' according to the embodiment of FIG. 3B and a second component 1 according to the embodiment of FIG. 3C, may be combined within a same system. Particularly, the two components 1 may be combined to form together, optionally with further sub-circuits or components) a SIP, an MCM, a system comprising a common substrate (e.g. PCB) on which two or more components 1 and 1' are mounted, wherein at least one of the components 1, 1' is embedded, at least partially, in a recess of the common substrate, or (as presented in FIG. 4) a PoP structure (wherein the component 1' comprises an own package substrate 14' having terminals 4', a first sub-circuit 2' and a second sub-circuit 3', together encapsulated by a mold mass 15').

While above exemplary embodiments have been described, it has to be noted that a great number of variation thereto exists. Furthermore, it is appreciated that the described exemplary embodiments only illustrate non-limiting examples of how the present invention can be implemented and that it is not intended to limit the scope, the application or the configuration of the herein-described apparatus' and methods. Rather, the preceding description will provide the person skilled in the art with constructions for implementing at least one exemplary embodiment, wherein it has to be understood that various changes of functionality and the arrangement of the elements of the exemplary embodiment can be made, without deviating from the subject-matter defined by the appended claims and their legal equivalents.

LIST OF REFERENCE NUMERALS 1 electronic component
2 first sub-circuit
2a functional logic design block, e.g., microcontroller, of first sub-circuit,
2b interface of first sub-circuit
2c energy supply of first functional block of first sub-circuit
2d energy supply of second functional block of first sub-circuit
2e energy supply of third functional block of first sub-circuit
2f first functional block of first sub-circuit
2g second functional block and test functionality of first sub-circuit
2h third functional block of first sub-circuit, reprogrammable
3 second sub-circuit
3a reprogrammable block, e.g., FPGA block, of second sub-circuit 3b controller block of second sub-circuit
3c memory block of second sub-circuit, e.g., embedded flash memory
3d interface block of second sub-circuit
3e access control block of second sub-circuit
3f energy management block of second sub-circuit
4 terminals of electronic component
4a terminals of first integrated device
4b terminals of second integrated device
5 pads on second sub-circuit
6 signal lines between first and second sub-circuits
6a,b,c dedicated measurement lines 6d signal lines between first and third sub-circuits
7 impedance matching device
8a primary energy supply
8b reserve energy supply
9 power supply lines to first sub-circuit
9a power supply lines to third sub-circuit
10 third sub-circuit
10a functional logic design of third sub-circuit
10b interface of third sub-circuit
10c energy supply of first functional block of third sub-circuit
10d energy supply of second functional block of third sub-circuit
10e first functional block of third sub-circuit
10f second functional block and test functionality of third sub-circuit
10' fourth sub-circuit
10" fifth sub-circuit
11 MCM substrate
12 first integrated device with first sub-circuit
13 second integrated device with second sub-circuit
14 package substrate of electronic component
14a package substrate of first integrated device
14b package substrate of second integrated device
15 mold mass of package
15a mold mass of first integrated device
15b mold mass of second integrated device
16 system-on-a-chip, SOC, comprising first and second sub-circuits
multi-layer printed circuit board, PCB with embedded first sub-circuits
20-26 first circuit blocks of the first sub-circuit
30-44 second circuit blocks of the second sub-circuit The invention has been described in the preceding using various exemplary embodiments. Other variations to the disclosed embodiments may be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit or device may fulfil the functions of several items recited in the claims.

The term "exemplary" used throughout the specification means "serving as an example, instance, or exemplification" and does not mean "preferred" or "having advantages" over other embodiments.

The mere fact that certain measures are recited in mutually different dependent claims or embodiments does not indicate that a combination of these measures cannot be used to advantage. Any reference signs in the claims should not be construed as limiting the scope.

What is claimed is:

1. An electronic component, comprising:
a first integrated sub-circuit having a defined interface and a defined fixed-hardware functionality;
a second, reconfigurable integrated sub-circuit being signal-connected via the interface to the first sub-circuit to exchange signals therewith; and
one or more terminals for electrically connecting the electronic component to its periphery, the second sub-circuit being configured as an interface circuit between the one or more terminals and the first sub-circuit;
wherein the second sub-circuit is further configured as a reconfigurable integrated testing unit to test said hardware functionality of the first sub-circuit by applying one or more input signals to the first circuit and evaluating one or more output signals received via the interface from the first sub-circuit in response to the one or more input signals for conformance with one or more predetermined test criteria; and wherein
the second sub-circuit is further configured to:
substitute one or more functionalities of the first sub-circuit by performing them in the second sub-circuit instead of the first sub-circuit; or
substitute one or more functionalities of a reprogrammable portion of the first sub-circuit by reprogramming that portion with program data being present in the second sub-circuit; or
extend one or more functionalities of the first sub-circuit by performing one or more extensions of functionalities of the first sub-circuit.

2. The electronic component of claim 1, wherein the component is configured such that any signal between the one or more terminals and the first sub-circuit of the component passes through the second sub-circuit, which thus forms a sole interface circuit between the one or more terminals and the first sub-circuit.

3. The electronic component of claim 1, wherein the second sub-circuit is further configured to perform one or more of the following functions in relation to the first sub-circuit:
measure or monitor one or more signals or electrical properties of the first sub-circuit;
control or feed-back control the first sub-circuit.

4. The electronic component of claim 1, wherein the functionality of the first sub-circuit to be substituted is a functionality that was detected by an error detection functionality of the electronic component as being defect.

5. The electronic component of claim 1, wherein the second sub-circuit is further configured to substitute or extend a test functionality being implemented in the first sub-circuit itself, at least in parts.

6. The electronic component of claim 1, wherein the second sub-circuit further comprises a programmable circuit structure.

7. The electronic component of claim 6, wherein the programmable circuit structure comprises one or more of:
a field-programmable gate array (FPGA); and
a programmable processor platform that is configured to emulate the functionality of the second sub-circuit, at least in parts and with respect to said testing of at least one of said fixed-hardware functionalities of the first sub-circuit, based on a real-time operating system running on the processor platform.

8. The electronic component of claim 1, wherein the signal connection between the first and the second integrated sub-circuits is an electrical connection that comprises one or more impedance matching devices being configured to optimize a proper transmission of RF-signals over the electrical connection.

9. The electronic component of claim 1, wherein the component is further configured to protect data to be communicated between the first and the second integrated sub-circuits over the signal connection by data encryption.

10. The electronic component of claim 1, wherein the second sub-circuit further comprises an access control functionality that is configured to monitor and control signals to be exchanged between with the component's periphery and the first sub-circuit based on predetermined security rules.

11. The electronic component of claim 1, wherein:
the second-sub-circuit further comprises an energy-management functionality for managing the supply of energy to the first sub-circuit or parts thereof; and
the energy-management functionality is configured to perform one or more of the following energy control tasks in response to receiving a respective energy control signal:
selectively switch on or off the respective supply of energy to one or more selected circuit portions of the first sub-circuit and, if present, additionally of the one or more further functional circuits;
selectively cause one or more selected circuit portions of the first sub-circuit to transition into a respective low-energy mode of operation;
selectively reroute at least parts of a supply of total available energy to one or more selected portions of the first sub-circuit, such that the energy is made available only or predominantly to those selected portions while the energy supply to non-selected portions is interrupted or reduced accordingly;
selectively connect a reserve energy supply, a device or circuit configured to reduce the supply of energy, or an energy regulating circuit to a respective energy supply path of one or more selected portions of the first sub-circuit to achieve an increase, a reduction or a regulation, respectively, of the supply of energy to the one or more selected portions of the first sub-circuit.

12. The electronic component of claim 11, wherein the component comprises in addition to the first and second sub-circuits one or more further sub-circuits, each having a defined interface and a defined fixed-hardware functionality, and the energy-management functionality of the second sub-circuit is further configured to perform one or more of the following energy control tasks in response to receiving a respective energy control signal:
selectively switch on or off the respective supply of energy to the one or more further sub-circuits;
selectively cause one or more of the one or more further sub-circuits to transition into a respective low-energy mode of operation;
selectively reroute at least parts of a supply of total available energy to one or more selected ones of first sub-circuit and the further sub-circuits, such that the energy is made available only or predominantly to these selected sub-circuits while the energy supply to non-selected ones of the first and the further sub-circuits is interrupted or reduced accordingly;
selectively connect a reserve energy supply, a device or circuit configured to reduce the supply of energy, or an energy regulating circuit to a respective energy supply path of one or more selected ones of the first sub-circuit or the further sub-circuits or selected portions thereof to achieve an increase, a reduction or a regulation, respectively, of the supply of energy to the one or more selected ones of the first sub-circuit or the further sub-circuits or selected portions thereof.

13. The electronic component of claim 11, wherein the component itself is further configured to generate the energy control signal based on a measurement of a flow of electrical energy through one or more of the terminals or over one or more electrical connections between the second sub-circuit and the first sub-circuit.

14. The electronic component of claim 11, wherein the energy-management functionality is further configured to:
receive the energy control signal in the form of an application-specific energy control signal from a host in the periphery of the component, when the host is executing a corresponding application program;
determine, based on said energy control signal, one or more of said energy control tasks and sub-circuits or portions thereof to be impacted by such one or more tasks; and
perform said determined one or more energy control tasks in relation to said determined one or more sub-circuits or portions thereof.

15. The electronic component of claim 1, wherein:
the electronic component comprises a first integrated circuit device comprising the first sub-circuit and a second integrated circuit device comprising the second sub-circuit; and
the first and second integrated circuit devices are arranged in one of the following manners:
a single package contains both the first and the second integrated circuit devices;
each of the first and second integrated circuit devices comprises an own package and the respective packages of the first and second integrated circuit devices are stacked atop each other;
the first and second integrated circuit devices are each connected to a common interconnect substrate, wherein the second integrated circuit device is embedded, at least partially, within a recess of the common interconnect substrate.

16. The electronic component of claim 15, wherein the first and second integrated circuit devices are arranged together with one or more further integrated circuit devices in one of the following manners:
a single package contains the first, the second, and the one or more further integrated circuit devices;
each of the first, the second, and the further integrated circuit devices comprises an own package and the respective packages of all of these integrated circuit devices are stacked atop each other;
the first, the second, and the further integrated circuit devices are each connected to a common interconnect substrate, wherein the second integrated circuit device is embedded, at least partially, within a recess of the common interconnect substrate.

17. The electronic component of claim 1, wherein the first sub-circuit, the second sub-circuit, and the signal connection therebetween are integrated together in a single system-on-chip (SOC).

18. The electronic component of claim 17, wherein the signal connection between the first and the second integrated sub-circuits comprises one or more dedicated measurement lines that are configured exclusively for testing, measuring or monitoring the first sub-circuit or its functionality at respective predetermined measurement points within the first sub-circuit without controlling or otherwise influencing said functionality.

19. An electronic system, comprising:
a first electronic component and a second electronic component, each comprising:
a first integrated sub-circuit having a defined interface and a defined fixed-hardware functionality;
a second, reconfigurable integrated sub-circuit being signal-connected via the interface to the first sub-circuit to exchange signals therewith; and
one or more terminals for electrically connecting the first electronic component and the second electronic component, respectively, to their respective periphery, the second sub-circuit being configured as an interface circuit between the one or more terminals and the first sub-circuit; wherein the second sub-circuit is further configured as a reconfigurable integrated testing unit to test said hardware functionality of the first sub-circuit by applying one or more input signals to the first circuit and evaluating one or more output signals received via the interface from the first sub-circuit in response to the one or more input signals for conformance with one or more predetermined test criteria; wherein the first electronic component comprises a first integrated circuit device comprising the first sub-circuit and a second integrated circuit device comprising the second sub-circuit; and the first and second integrated circuit devices are arranged in one of the following manners:

a single package contains both the first and the second integrated circuit devices;

each of the first and second integrated circuit devices comprises an own package and the respective packages of the first and second integrated circuit devices are stacked atop each other; or the first and second integrated circuit devices are each connected to a common interconnect substrate, wherein the second integrated circuit device is embedded, at least partially, within a recess of the common interconnect substrate; wherein the first sub-circuit, the second sub-circuit, and the signal connection therebetween of the second electronic component are integrated together in a single system-on-chip (SOC);

the system further comprising one or more terminals for electrically connecting the system to its periphery.

* * * * *